United States Patent [19]
Jeong

[11] Patent Number: 5,607,872
[45] Date of Patent: Mar. 4, 1997

[54] METHOD OF FABRICATING CHARGE COUPLED DEVICE

[75] Inventor: Jae H. Jeong, Seoul, Rep. of Korea

[73] Assignee: LG Semicon Co., Ltd., Seoul, Rep. of Korea

[21] Appl. No.: 477,299

[22] Filed: Jun. 6, 1995

Related U.S. Application Data

[62] Division of Ser. No. 250,757, May 26, 1994, Pat. No. 5,442,207.

[30] Foreign Application Priority Data

Aug. 18, 1993 [KR] Rep. of Korea ................... 16030/1993

[51] Int. Cl.$^6$ .......................... H01L 21/265; H01L 21/70; H01L 27/00
[52] U.S. Cl. ................................................. 437/50; 437/53
[58] Field of Search ........................ 437/50, 53; 257/246, 257/247, 248, 249, 250, 251

[56] References Cited

U.S. PATENT DOCUMENTS

| | | |
|---|---|---|
| 3,796,932 | 3/1974 | Amelio et al. . |
| 4,206,372 | 6/1980 | Levine . |
| 4,215,357 | 7/1980 | Kohyama et al. ....................... 257/248 |
| 4,766,089 | 8/1988 | Davids et al. ............................. 437/53 |
| 5,438,211 | 8/1995 | Nakamura et al. ....................... 257/249 |

FOREIGN PATENT DOCUMENTS 54-128684  10/1979  Japan .
62-126670   6/1987  Japan .

Primary Examiner—Mary Wilczewski
Assistant Examiner—Brian K. Dutton
Attorney, Agent, or Firm—Morgan, Lewis and Bockius LLP

[57] ABSTRACT

Charge couples devices and methods for the fabrication of the same are disclosed.

The charge coupled device is structured to comprise: a first electrode consisting of a first region and second region having lower resistance than the first region; and a second electrode consisting a first region and a second region having lower resistance than this first region, the first region of the first electrode being adjacent to said first region of the second region at an interval of an insulating film.

Capable of utilizing the force of electrical field, the charge coupled device is superior in charge transfer efficiency as well as charge transfer velocity.

In addition, it has capability to improve the performances of high picture quality solid state image sensing device as well as time delay device, which both necessitate a charge coupled device and operates at high frequencies.

Furthermore, a solid state image sensing device employing the charge coupled device is not degraded in a dark state of generating a few number of pulse charges.

26 Claims, 7 Drawing Sheets

METHOD OF FABRICATING CHARGE COUPLED DEVICE

CROSS-REFERENCE TO RELATED APPLICATION

This is a divisional of application Ser. No. 08/250,757, filed May 26, 1994 now U.S. Pat. No. 5,492,207.

BACKGROUND OF THE INVENTION

The present invention relates, in general, to charge coupled devices and methods for the fabrication of the same. More specifically, the present invention is concerned with a structure of charge coupled electrode capable, of improving charge transfer efficiency, and methods for fabricating the same.

A charge coupled device, which transfers pulse charges in one direction by use of the potential difference within a semiconductor device induced by the potential difference applied to each transfer electrode and which is widely utilized for a solid state image sensing device, and signal delay, is generally structured to have an array of fine transfer electrodes which are separated from one another by an insulating film on a silicon substrate.

For better understanding of the background of the present invention, a description of conventional charge coupled devices is to be given with reference to some drawings.

Referring to FIG. 1, there is shown a conventional structure of a charge coupled device. Such structure of charge coupled device is fabricated as follows.

First, into a p type silicon substrate 1 n type impurity ions are implanted, to form a buried charge coupled device (hereinafter referred to as "BCCD") region 2 over which an oxide film 3 serving as an insulating film is then formed entirely.

Over the oxide film 3, there is deposited a conductive layer of polysilicon, which is subsequently patterned by use of photoetch, so as to form a plurality of spaced-apart, parallel first transfer electrodes 13.

Thereafter, using the first transfer electrodes 13 as a mask, a barrier 9 is settled on the surface of the BCCD region 2 by ion implantation, and the first transfer electrodes 13 are insulated by an oxide film. Then, a plurality of spaced-apart, parallel second transfer electrodes 14 are formed of polysilicon between the first transfer electrodes.

In such charge coupled device fabricated, each of the first transfer electrodes 13 is paired with a nearby one of the second transfer electrodes 14. Each of these electrode pairs is connected with either a first clock pulse and a second clock pulse ($H\Phi_1$, $H\Phi_2$) which are alternatively applied to the electrode pairs.

Referring now to FIG. 2, there is illustrated the operating principle of the conventional two-phase charge coupled device. While FIG. 2A is an example of the first and the second clock pulses applied to the transfer electrode of the two-phase charge coupled device, FIG. 2B shows a potential distribution induced within a semiconductor when applying the first and the second clock pulses to the transfer electrodes, and a migration course of charges according to the potential distribution.

In detail, at t=1, the first clock pulse ($H\Phi_1$) is in a state of "low", whereas the second clock pulse ($H\Phi_2$) is in a state of "high". At the moment, a potential well becomes deepest at below the transfer electrode 13, so that the pulse charges are trapped in this well.

At t=2, the first clock pulse ($H\Phi_1$) is in a high state, whereas the second clock pulse ($H\Phi_2$) is in a low state. Accordingly, the deepest potential well is formed below the first transfer electrode 13 applied with the first clock pulse ($H\Phi_1$), and the potential well of the second transfer electrode 14 applied with the second clock pulse ($H\Phi_2$) is risen, so that pulse charges move into below the first transfer 13 which has the deepest well and which is applied with the first clock pulse ($H\Phi_1$).

At t=3, the pulse charges move like at t=2. In this point, the pulse charge has directivity to move only rightward by virtue of a potential barrier formed below the left electrode of the transfer electrode pair consisting of the first transfer electrode and the second transfer electrode.

Repetition of such first and second clock pulses ($H\Phi_1$, $H\Phi_2$) allows the pulse charge to be transferred.

However, the conventional charge coupled device is problematic in charge transfer. To scrutinize the potential distribution shown in FIG. 2B, it could be found that the edge portion below each the transfer electrodes shows a rapid change of the potential which allows the pulse charge to smoothly move thereat, whereas since the central portion shows equipotential distribution, the pulse charge moves into a neighboring electrode by not the force of electrical field but only diffusion by which the charge transfer is slow in velocity as well as difficult to complete.

Such phenomena are more apparent as the frequency applied to the transfer electrode increases. Therefore, the conventional charge coupled device operates in low performance at high frequencies.

SUMMARY OF THE INVENTION

For solving the problems, the present inventors have recognized that there exists a need for a novel structure of charge coupled device, superior in transferring charges, and found that the efficiency of charge transfer can be improved by delaying the rising time and falling time of the clock pulses applied to transfer electrodes in the transferring direction within the transferring electrode, so as to form potential gradients in a channel which transfers the charges.

In accordance with an aspect of the present invention, there is provided a charge coupled device comprising: a first electrode consisting of a first region and a second region having lower resistance than the first region; and a second electrode consisting of a first region and a second region having lower resistance than this first region, the first region of the first electrode being adjacent to the first region of the second region at an interval of an insulating film.

According to another aspect of the present invention, there is provided a method for the fabrication of a charge coupled device, comprising the steps of: making a second conductive charge coupled region over a first conductive semiconductor substrate; coating a first insulating film on the second conductive charge coupled region; forming a first conductive layer over the first insulating film; forming a plurality of spaced-apart, first low resistance regions in predetermined portions of the first conductive layer, the first low resistance regions having lower resistance than the first conductive layer; patterning the first conductive layer comprising the first low resistance region, so as to form a plurality of first electrodes each of which has one of the lower resistance regions in one side; coating the entire resulting substrate with a second insulating film; constructing an impurity region in the vicinity of the surface of each charge coupled region between the first electrodes; forming a second conductive layer on the second insulating film; forming a plurality of spaced-apart, second low resistance regions in the second conductive layer, each of which is lower resistance than the second conductive layer and is adjacent to each of the first low resistance regions of the first electrode; and patterning the second conductive layer comprising the second low resistance regions in such a way to include the second low resistance region in the side of the first low resistance region, so as to form a plurality of second electrodes each of which exists between the first electrodes and comprises one of the second low resistance regions According to a further aspect of the present invention, there is provided a method for the fabrication of charge coupled device, comprising the steps of: making a second conductive charge coupled region over a first conductive semiconductor substrate; coating a first insulating film on the second conductive charge coupled region; forming a first conductive layer over the first insulating film; patterning the first conductive layer to form a plurality of spaced-apart, first electrode pattrns; coating the entire resulting substrate with a second insulating film; constructing an impurity region in the vicinity of the surface of each charge coupled region between the first electrode patterns; forming a plurality of spaced-apart, second electrode patterns on the charge coupled region, each of which is as high as the first electrode pattern and present between of the first electrode patterns; coating the entire resulting substrate with a third insulating film; forming a low resistance region in both one portion of each the first electrode patterns and one portion of each the second electrode patterns, so as to form at once a first electrode and a second electrode, the one portion of each the first electrode patterns being adjacent to the one portion of each of the first electrode patterns.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE INVENTION

Figure 1:
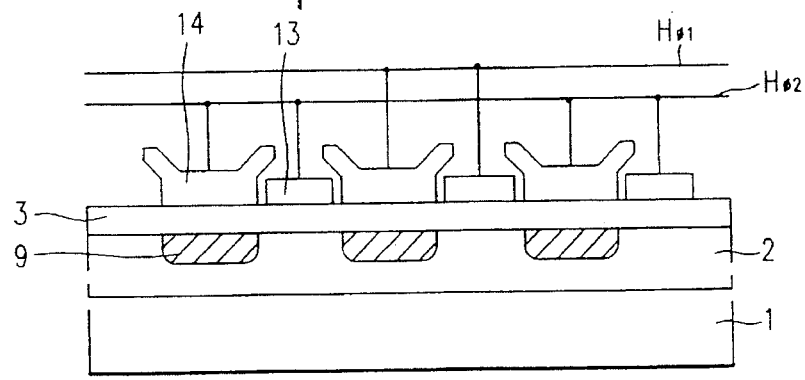
FIG. 1 is a schematic, cross sectional view illustrating a structure of a conventional charge coupled device.

Hereinafter, the preferred embodiments of the present invention will be described with reference to the accompanying drawings, wherein like reference numerals designate like parts, respectively.

Figure 3:
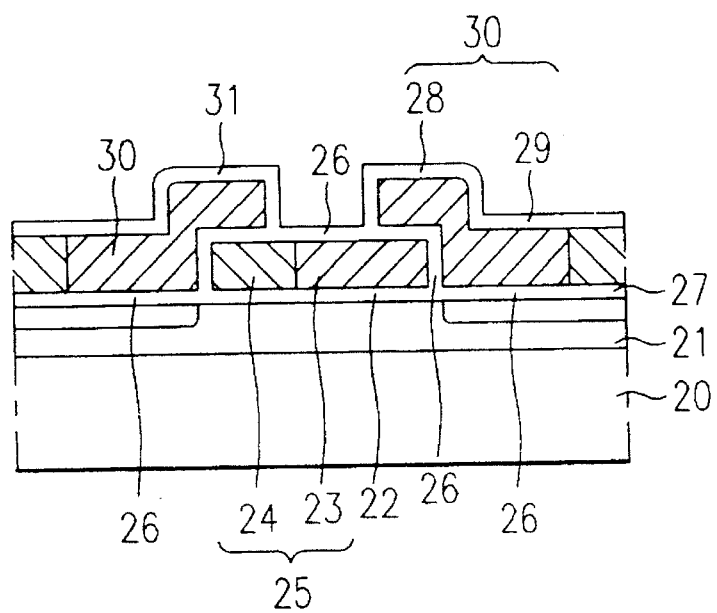
FIG. 3 is a schematic, cross sectional view illustrating a structure of a charge coupled device according to a first embodiment of the present invention.

Referring initially to FIG. 3, there is shown a charge coupled device according to a first embodiment of the present invention. As shown in this figure, the charge coupled device is comprised of a first conductive semiconductor substrate 20, e.g. p type silicon substrate, overlaid by an n type BCCD region 21, a second conductive charge coupled region, covered with an insulating film 22 on which a plurality of first regions 23 and a plurality of lower resistant second regions 24 are formed, each of the former along with nearby one of the latter constituting a first transfer electrode 25 on the edge portion of which a second transfer electrode 30 consisting of a first region 28 and a low resistant second region is put, extending over the BCCD region between the spaced-apart first transfer electrodes 25, the first region 23 of the first transfer electrode 25 is adjacent to the first region 28 of the second transfer electrode at an interval of the insulating film 26, and the second region 24 of the former 25 is adjacent to the second region 29 of the latter 30 at an interval of that, as well.

The charge coupled device according to the present invention also comprises an impurity region 27 to serve as a barrier which is formed below each of the second transfer electrodes in the vicinity of the surface of the BCCD region 21. In the first transfer electrode 25, the first region 23 is more extensively formed than the second region 24, whereas, the second transfer charge 30, the second region 29 is more extended than the first region 28.

Each the first regions 23, 28 of the first and second transfer electrodes 25, 30 is formed of, for example, polysilicon, while each the second regions 24, 29 is formed of, for example, polysilicon doped with dense impurities, respectively in order to increases the resistance of the latter more than that of the former.

Figure 4:
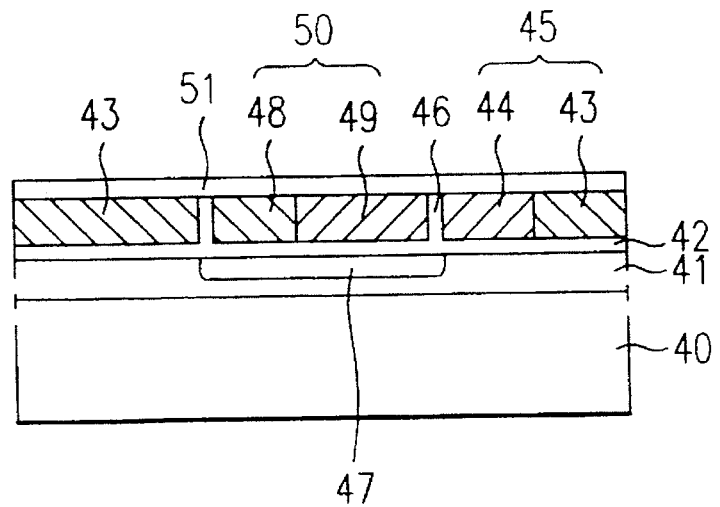
FIG. 4 is a schematic, cross sectional view illustrating a structure of a charge coupled device according to a second embodiment of the present invention.

Referring now to FIG. 4, there is shown a charge coupled device according to a second embodiment of the present invention. As shown in this figure, the charge coupled device is comprised of a first conductive semiconductor substrate 40, e.g. p type silicon substrate, overlaid by an n type BCCD region 41, a second conductive charge coupled region, covered with an insulating film 42 on which a plurality of first regions 43 and a plurality of lower resistant second regions 44 are formed, each of the former along with nearby one of the latter constituting a first transfer electrode 45 and on which a plurality of first regions 48 and a plurality of lower resistant second regions 49 are formed, each of the former along with nearby one of the latter constituting a second transfer electrode 50 which is as high as the first transfer electrode 45, the first transfer electrode 45 is located present between the second transfer electrodes 50.

The first region 43 of the first transfer electrode 45 is adjacent to the first region 48 of the second transfer electrode spaced by the insulating film 46. The second region 44 of the former 45 is adjacent to the second region 49 of the latter 50 at that interval.

The charge coupled device according to the second embodiment of the present invention includes an impurity region 27 serving as a barrier, which is formed below each of the second transfer electrodes 50 in the vicinity of the surface of the BCCD region 21. In the first transfer charge 25, the first region 23 is more extensively formed than the second region 24, whereas, in the second transfer charge 30, the second region 29 is more extended than the first region 28.

Each of the first regions 23, 28 of the first and second transfer electrodes 25, 30 is formed of, for example, polysilicon, while each of the second regions 24, 29 is formed of, for example, polysilicon doped with dense impurities, respectively in order to increase the resistance of the second regions more than that of the first.

Figure 2A:
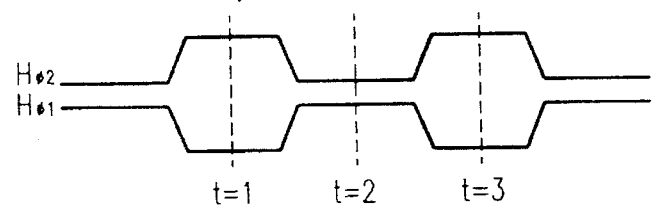
FIG. 2A shows an example of first and second clock pulses applied to the transfer electrode of two-phase charge coupled device.
Figure 2B:
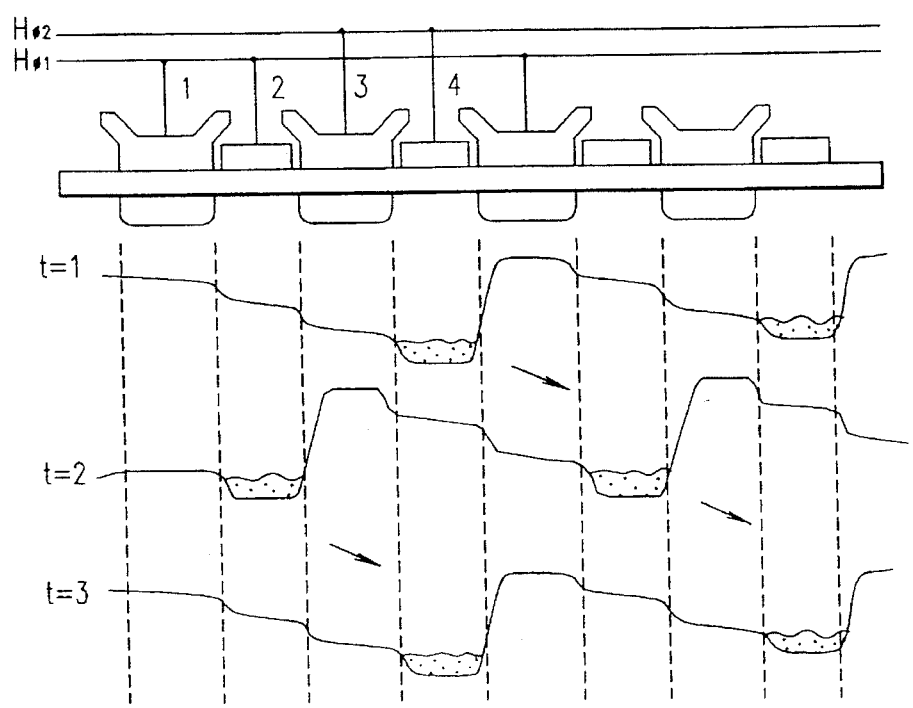
FIG. 2B is a schematic view illustrating the relation of the conventional structure with a potential distribution induced within a semiconductor when applying the first and the second clock pulses to the transfer electrodes.
Figure 5A:
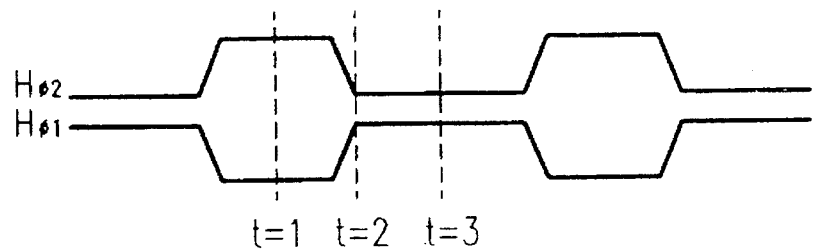
FIG. 5A shows an example of first and second clock pulses applied to the transfer electrode of the charge coupled device according to the present invention.
Figure 5B:
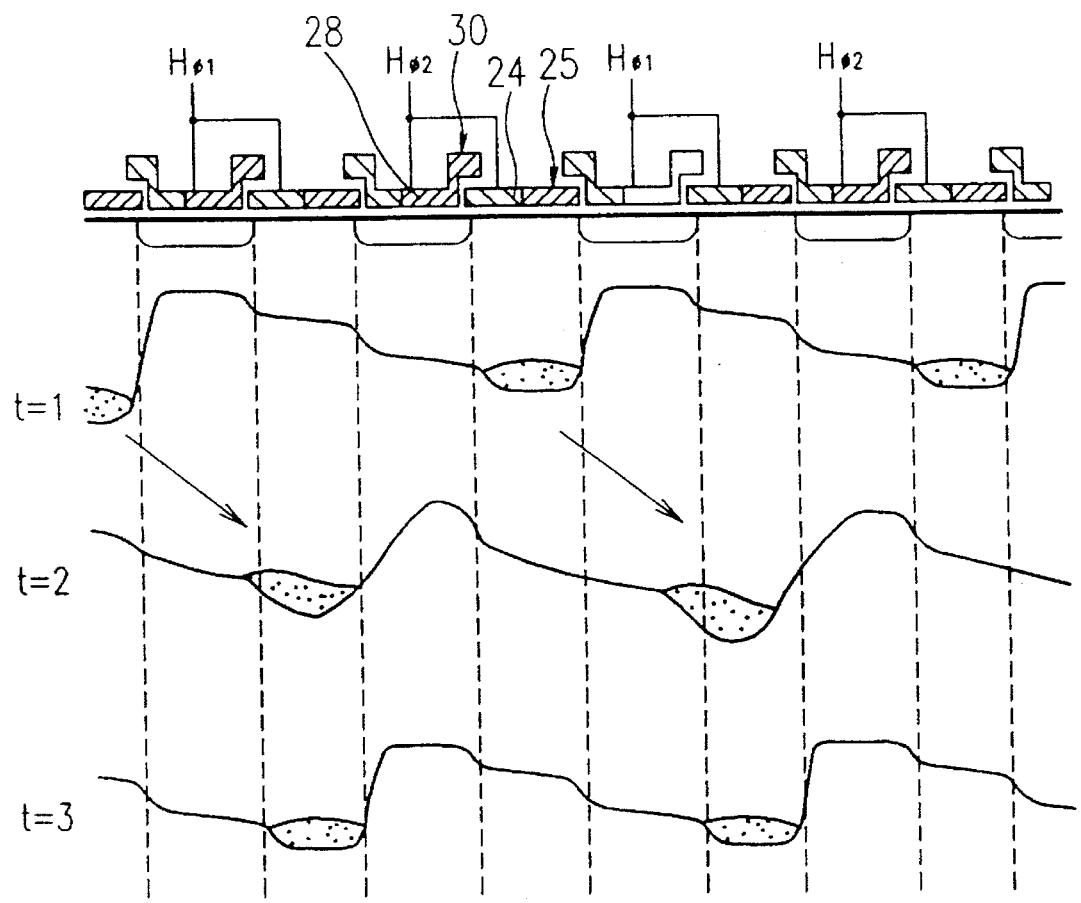
FIG. 5B is a schematic view illustrating the relation of the present structure with a potential distribution induced within a semiconductor when applying the first and the second clock pulses to the transfer electrodes.

With reference to FIGS. 5A and 5B, the operation of the charge coupled device according to the present invention will be described. While FIG. 2A is an example of the clock pulses applied to the transfer electrode of two-phase charge coupled device, FIG. 2B shows a potential distribution induced within a semiconductor when applying the clock pulses to the transfer electrodes, and a migration course of charges depending on the potential distribution.

When saw tooth waves from rectangular waves, shown in FIG. 5A, are applied, since, at t=1, a first clock pulse (H$\Phi_1$), as shown in FIG. 5B, is in the state of "low" and a second clock pulse (H$\Phi_2$) is in the state of "high", the deepest potential well comes to be formed below the first transfer electrode 25 applied with the second clock pulse (H$\Phi_2$), and pulse charges are trapped in the well.

At t=2, the first clock pulse (H$\Phi_1$) is turned from the low state into high, while the second clock is turned from the high state to the low. At this time, each of the impurity-doped regions 24, 29 of the first and second transfer electrodes 25, 30 corresponds to such changes of the clock pulses without time delay. On the other hand, in transferring the clock pulses (H$\Phi_1$,H$\Phi_2$) at t=2, time delay is generated in the un-doped regions 23, 28 by RC time constant. Such phenomena are attributed to the fact that the clock pulses (H$\Phi_1$,H$\Phi_2$) are changed depending on the change of the potential with time and there is exists a time change due to over-shoot after the changes of the clock pulses.

Accordingly, at t=2, owing to the impurity-doped regions free of the time delay of the transfer electrode and the un-doped regions with the time delay, a potential gradient is generated in a transfer channel, so that charge transfer is achieved not only by the diffusion with heat energy but also by the force of an electrical field. Consequently, the charge transfer in the charge coupled device according to the present invention is superior in efficiency and improved in velocity.

At t=3, the clock pulses (H$\Phi_1$, H$\Phi_2$), as shown in FIG. 5a, are in a static state, so that the potential of direct current comes to be applied, depriving the transfer channel of the potential gradient. The disappearance of the potential gradient forms a charge well similar to that of the conventional structure. Repetition of such clock. pluses transfers the pulse charges in one direction.

Now, let us turn to methods for fabricating the charge coupled devices according to the embodiments of the present invention. Referring to FIGS. 6A through 6G, there is illustrated a method for fabricating the charge coupled device according to the first embodiment of the present invention.

Figure 6A:
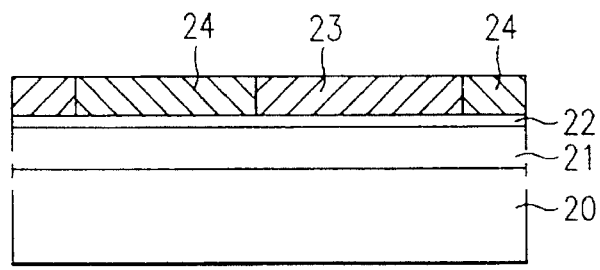
FIGS. 6A through 6G are schematic, cross sectional views illustrating a method for the fabrication of the charge coupled device according to the first embodiment of the present invention.

First, as illustrated in FIG. 6A, into a p type monosilicon substrate 20 n type impurities ions are implanted, to form a BCCD region 21, a charge coupled region, over which there is then formed a first insulating film 22, e.g., silicon oxide film which, in turn, is covered with a first conductive layer, e.g. polysilicon layer. It is also illustrated in this figure that high density impurities are selectively doped in the polysilicon layer 23, so as to form a plurality of spaced-apart, first impurity-doped regions 24 therein. As a result, in the polysilicon layer, the first impurity-doped region and an un-doped region alternate.

Figure 6B:
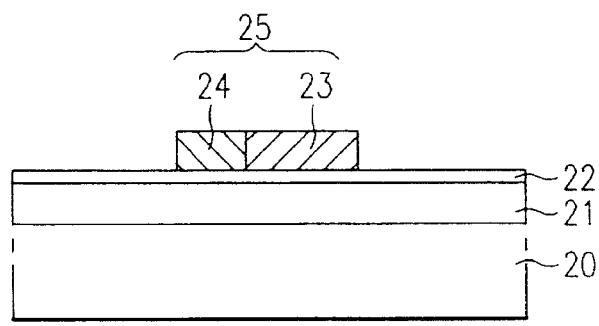

Next, as illustrated in FIG. 6B, the polysilicon layer comprising the spaced-apart, first impurity regions and the un-doped regions is patterned by use of photoetch, so as to form a plurality of first transfer electrodes 25 each of which consists of a smaller part of the first impurity-doped region and a greater part of the un-doped region.

Figure 6C:
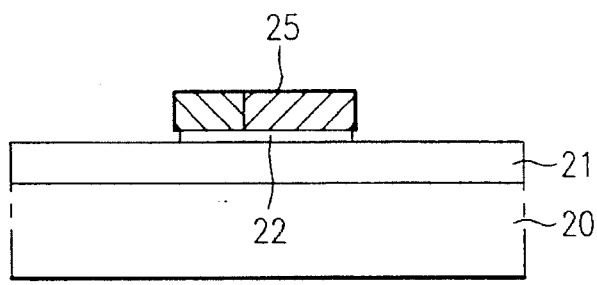

Thereafter, as illustrated in FIG. 6C, using a plurality of the first transfer electrodes 25 as a mask, the first insulating film 22, a silicon oxide film, is etched.

Figure 6D:
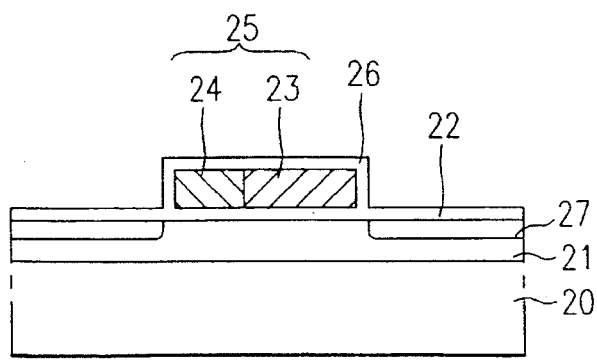

Subsequently, as illustrated in FIG. 6D, on the resulting entire surface comprising the first transfer electrodes and the substrate, there is coated a second insulating film 26, an oxide film, and then, using the first transfer electrodes 25 as a mask, impurity ions are implanted into the surface of the BCCD region 21, so as to form an impurity region 27, a barrier layer.

Figure 6E:
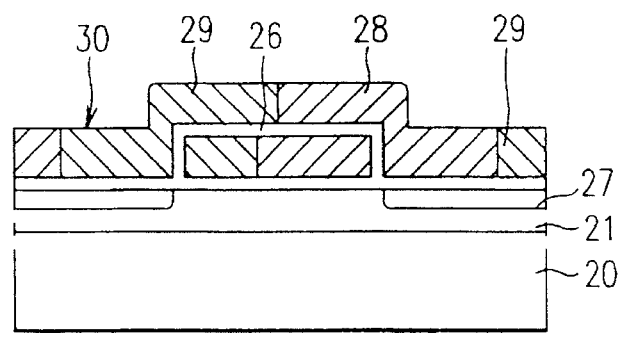

Following this, as illustrated in FIG. 6E, over the second insulating film 26, there is formed a second conductive layer 28, e.g. polysilicon layer, which is then selectively doped with impurities, to form a plurality of spaced-apart, second impurity-doped regions each of which is adjacent only to the side of the first impurity-doped region of the first transfer electrode 25, covering not the un-doped region of the first transfer electrode 25 but the first impurity-doped region. As a result, in the polysilicon layer, the second impurity-doped region and an un-doped region alternate.

Figure 6F:
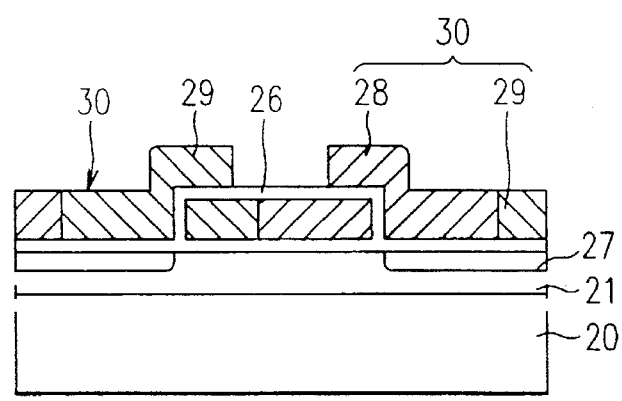

Next, as illustrated in FIG. 6F, the polysilicon layer comprising a plurality of the spaced-apart second-doped regions is patterned by use of photoetch in such a way to set each the second-doped region 29 only at the side of the first impurity-doped region 24 of the first transfer electrode 25, to form a plurality of second transfer electrodes 30 consisting of a greater part of impurity-doped region and a smaller part of un-doped region, each being between the first transfer electrodes 25.

Figure 6G:
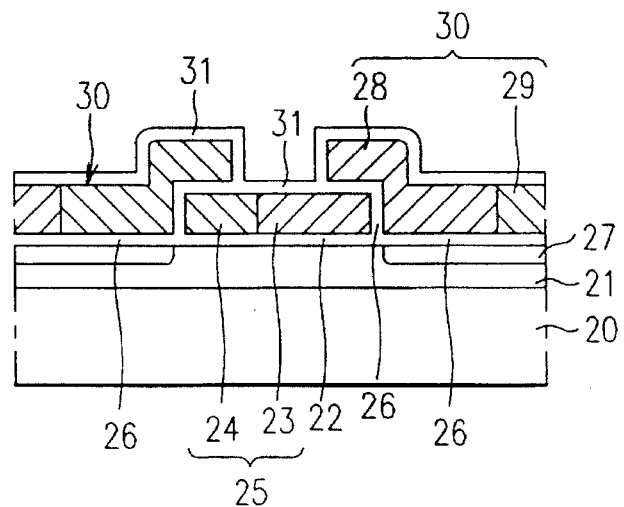

Finally, as illustrated in FIG. 6G, a third insulating film 31, e.g. oxide film, is formed over the entire surface of the resulting structure, followed by the formation of wiring (not shown) to apply clock pulses like the conventional structure stated. At this time, the wiring is arranged in such a way to apply the clock pulses only to the impurity-doped regions out of the first and the second transfer electrode patterns 25, 30.

Turning now to FIGS. 7A through 7G, there is illustrated a method for fabricating the charge coupled device according to second embodiment of the present invention.

Figure 7A:
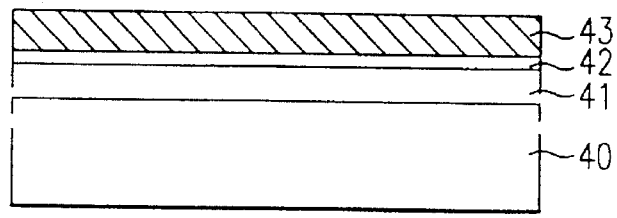
FIGS. 7A through 7G are schematic, cross sectional views illustrating a method for the fabrication of the charge coupled device according to the second embodiment of the present invention.

First, as illustrated in FIG. 7A, into a p type monosilicon substrate 40 are n type impurities ions are implanted, to form a BCCD region 41, a charge coupled region, over which there is then formed a first insulating film 42, e.g., silicon oxide film which, in turn, is covered with a first conductive layer, e.g. polysilicon layer.

Figure 7B:
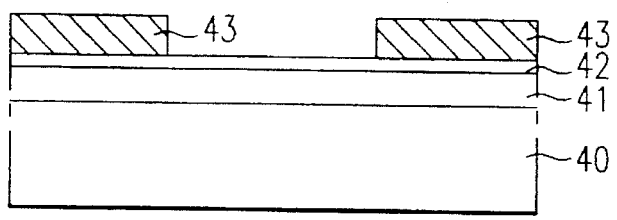

Next, as illustrated in FIG. 7B, the polysilicon layer 43 is patterned by use of photoetch, to form a plurality of spaced-apart, first transfer electrode 43.

Figure 7C:
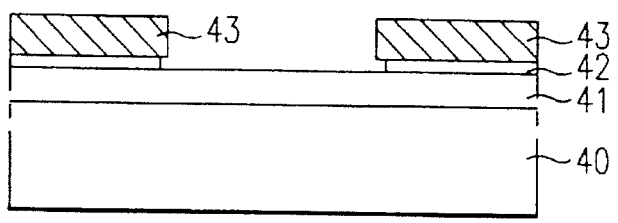

Subsequently, as illustrated in FIG. 7C, using a plurality of the first transfer electrode patterns as a mask, the first insulating film 42 is etched.

Figure 7D:
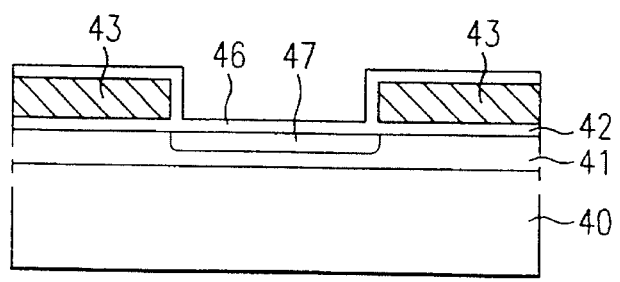

Thereafter, as illustrated in FIG. 7D, on the resulting entire surface comprising the first transfer electrode patterns and the substrate, there is coated a second insulating film 46, an oxide film, and then, using the first transfer electrode patterns 45 as a mask, impurity ions are implanted into the surface of the BCCD region, so as to form an impurity region 47, a barrier layer.

Figure 7E:
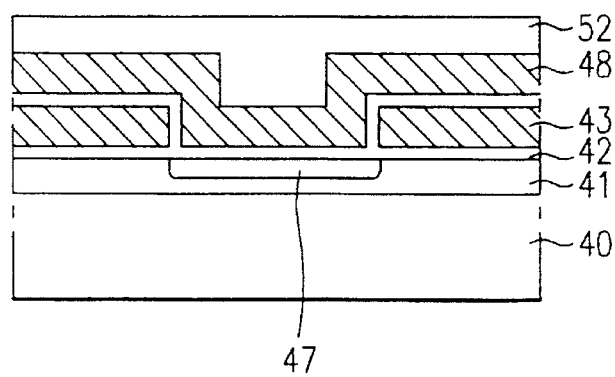

Following this, as illustrated in FIG. 7E, over the second insulating film 46, there is formed a second conductive layer 48, e.g. polysilicon layer on which a planarization layer 52 is formed. As a result, the resulting structure is planed in surface.

Figure 7F:
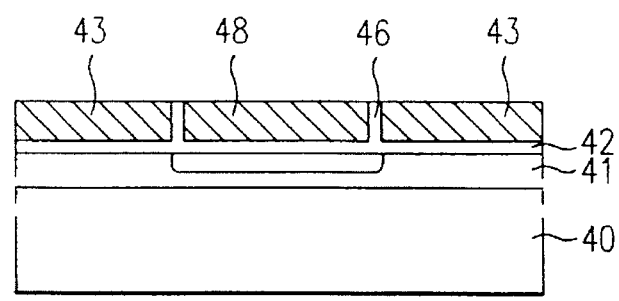

Next, as illustrated in FIG. 7F, the planarization layer 52 is subjected to etch back, and thus exposed second conductive layer 48 is also subjected to etch back, in order to make the second conductive layer 48 be as high as the first transfer electrode pattern 43. As a result, a plurality of second transfer electrode pattern 48' are formed, existing between the first transfer electrode patterns 43.

Figure 7G:
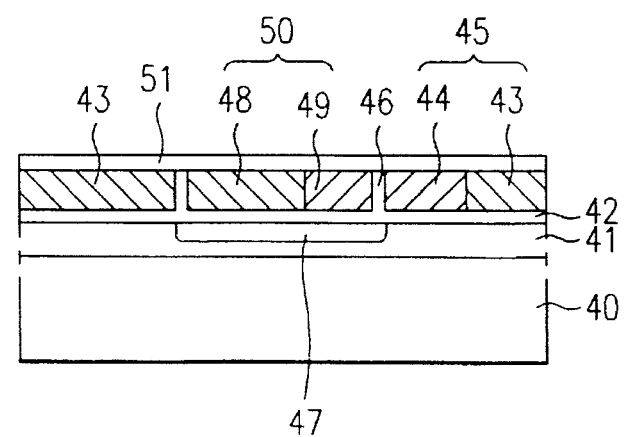

Finally, in illustrated as FIG. 7G, over the entire resulting structure in which the second transfer electrode pattern 48' and the first transfer electrode pattern 43 alternate, there is formed a third insulating film 51, an oxide film, and then, high density impurity ions are implanted into a portion of each the first and the second transfer electrode patterns 43, 48', so as to form a first impurity-doped region 44 in each of the first transfer electrode patterns 43 as well as a second impurity-doped region 49 in each of the second transfer electrode 48', both of the impurity-doped regions being adjacent to each other. As a result, both a plurality of spaced-apart first electrodes 30 each of which consists of the first impurity-doped region 44 and the first conductive layer 43 and a plurality of spaced-apart second electrodes 50 each of which consists of the second impurity region 49 and the second conductive region 48 are formed simultaneously. Although not shown in the figure, wirings are formed in order to apply clock pulses like the conventional structure stated. At this time, the wirings are arranged in such a way to apply the clock pulses only to the impurity-doped regions 44, 49 out of the first and the second transfer electrodes 45, 50.

As described hereinbefore, the charge coupled devices according to the present invention, capable of utilizing the force of electrical field, are superior in charge transfer efficiency as well as charge transfer velocity to the conventional one utilizing only the diffusion with heat energy. Therefore, they have capability to improve the performances of high picture quality solid state image sensing device as well as time delay devices, which both necessitate a charge coupled device and operate at high frequencies. In addition, a solid state image sensing device employing the charge coupled device according to the present invention is not degraded in a dark state of generating a few number of pulse charges.

Whilst the present invention has been described with reference to certain preferred embodiments, it will be appreciated by those skilled in the art that numerous from the spirit or scope of the invention as broadly described.

What is claimed is:

1. A method of fabricating a charge coupled device, the method comprising the steps of:

forming a charge coupled region of a second conductivity type on a semiconductor substrate of a first conductivity type that is different from the second conductivity type;

coating a first insulating film on the charge coupled region;

forming a first conductive layer on the first insulating film;

forming a plurality of spaced-apart, first low resistance regions in portions of the first conductive layer, each of the plurality of spaced-apart first low resistance regions having a lower resistance than the first conductive layer;

patterning the first conductive layer comprising the plurality spaced-apart, first low resistance regions, so as to form a plurality of first electrodes, wherein each of the plurality of first electrodes includes one of the plurality of spaced-apart, first low resistance regions;

coating the plurality of first electrodes and the charged coupled region with a second insulating film;

forming an impurity region in the surface of the charge coupled region between the plurality of first electrodes;

forming a second conductive layer on the second insulating film;

forming a plurality of spaced-apart, second low resistance regions in the second conductive layer, wherein each of the plurality of spaced-apart, second low resistance regions has a lower resistance than the second conductive layer and is adjacent to a respective one of the plurality of spaced-apart, first low resistance regions of the first electrode; and patterning the second conductive layer comprising the plurality of spaced-apart, second low resistance regions in such a way to include the plurality of spaced-apart, second low resistance regions in the side of the plurality of spaced-apart, first low resistance regions, so as to form a plurality of second electrodes, wherein each of the plurality of second electrodes exists between the plurality of first electrodes and comprises one of the plurality of spaced-apart, second low resistance regions.

2. The method of fabricating a charge coupled device according to claim 1, wherein each of the first conductive layer and the second conductive layer is formed by the deposition of polysilicon.

3. The method of fabricating a charge coupled device according to claim 1, wherein the step of forming the plurality of spaced-apart first low resistance regions in the first conductive layer is carried out by selectively implanting impurity ions into the first conductive layer.

4. The method of fabricating a charge coupled device according to claim 1, wherein each of the plurality of first electrodes is formed by carrying out a patterning process such that the portions of the first conductive layer in which the spaced-apart, first low resistance regions are formed are smaller than respective remaining portions of the first conductive layer.

5. The method of fabricating a charge coupled device according to claim 1, wherein the step of forming the plurality of spaced-apart, second low resistance regions in the second conductive layer is carried out by selectively implanting impurity ions into the second conductive layer.

6. The method of fabricating a charge coupled device according to claim 1, wherein each of the plurality of spaced-apart, second low resistance regions is so formed as to be adjacent to a respective one of the plurality of spaced-apart, first low resistance regions and not to exceed an interface between the respective one of the plurality of spaced-apart, first low resistance regions and the first conductive layer.

7. The method of fabricating a charge coupled device according to claim 1, wherein the plurality of second electrodes are formed by patterning the second conductive layer such that the portions of the second conductive layer in which the spaced-apart, second low resistance regions are formed are larger than respective remaining portions of the second conductive layer.

8. The method of fabricating a charge coupled device according to claim 1, further comprising a step of connecting wirings with the plurality of spaced-apart, first low resistance regions of the plurality of first electrodes and the plurality of spaced-apart, second low resistance regions of the plurality of second electrodes, to apply clock pulses to the plurality of spaced-apart, first and second low resistance regions.

9. A method of fabricating a charge coupled device, comprising the steps of:

forming a charge coupled region of a second conductivity type on a semiconductor substrate of a first conductivity type that is different from the second conductivity type;

coating a first insulating film on the charge coupled region;

forming a first conductive layer on the first insulating film;

patterning the first conductive to form a plurality of spaced-apart, first electrode patterns;

coating the plurality of spaced-apart, first electrode patterns and the charge coupled region with a second insulating film;

forming an impurity region in the surface of the charge coupled region between each of the plurality of spaced-apart, first electrode patterns;

forming a plurality of spaced-apart, second electrode patterns on the charge coupled region between the plurality if spaced-apart first electrode patterns, each of the plurality of second electrode patterns being as high as the plurality of spaced-apart, first electrode patterns;

coating the plurality of spaced-apart, first electrode patterns and the plurality of spaced-apart second electrode patterns with a third insulating film;

forming a low resistance region in a portion of each of the plurality of spaced-apart, first electrode patterns and in a portion of each of the plurality of spaced-apart, second electrode patterns, so as to form a first electrode and a second electrode, the portion of each of the plurality of spaced-apart, first electrode patterns being adjacent to the portion of each of the plurality of spaced-apart, first electrode patterns.

10. The method of fabricating a charge coupled device according to claim 9, wherein the step of forming the plurality of spaced-apart, second electrode patterns is carried out by forming a second conductive layer on the second insulating film, forming a planarization layer on the second conductive layer, etching the planarization layer to expose the second conductive layer, and etching the exposed second conductive layer.

11. The method of fabricating a charge coupled device according to claim 9, wherein the step of forming the low resistance region is carried out by selectively implanting impurity ions in adjacent portions of the plurality of spaced-apart, first electrode patterns and the plurality of spaced-apart, second electrode patterns.

12. The method of fabricating a charge coupled device according to claim 9, wherein the first electrode is formed by carrying out a patterning process such that the portions of the first conductive layer in which the spaced-apart, low resistance regions are formed are smaller than respective remaining portions of the first conductive layer.

13. The method of fabricating a charge coupled device according to claim 9, further comprising a step of connecting wirings to the low resistance region of each of the plurality of spaced-apart, first electrodes and to the low resistance region of each of the plurality of spaced-apart, second electrodes for applying clock pulses to the plurality of spaced-apart, first and second low resistance regions.

14. A method of fabricating a charge coupled device on a substrate of a first conductivity type, the method comprising the steps of:

forming a charge coupled region of a second conductivity type on the substrate;

forming a first insulating film on the charge coupled region;

forming a first conductive layer on the first insulating film;

forming a first low resistance region in a portion of the first conductive layer, the first low resistance region having a lower resistance than a remaining portion of the first conductive layer;

patterning the first conductive layer to form a first electrode;

forming a second insulating film on the first electrode and the charge coupled region;

forming an impurity region in the surface of the charge coupled region;

forming a second conductive layer on the second insulating film;

forming a second low resistance region in a portion of the second conductive layer adjacent to the first low resistance region of the first electrode, the second low resistance region having a lower resistance than a remaining portion of the second conductive layer; and patterning the second conductive layer to form second and third electrodes adjacent to the first electrode.

15. The method of fabricating a charge coupled device according to claim 14, wherein the first and second conductive layers comprise polysilicon.

16. The method of fabricating a charge coupled device according to claim 14, wherein the step of forming the first low resistance region includes the step of implanting impurity ions into the first conductive layer.

17. The method of fabricating a charge coupled device according to claim 14, wherein the first conductive layer is patterned such that the portion of the first conductive layer in which the first low resistance region is formed is smaller than the remaining portion of the first conductive layer.

18. The method of fabricating a charge coupled device according to claim 14, wherein the step of forming the second low resistance region includes the step of implanting impurity ions into the second conductive layer.

19. The method of fabricating a charge coupled device according to claim 14, wherein the second conductive layer is patterned to remove the second conductive layer above an interface between the portion of the first conductive layer in which the first low resistance region is formed and the remaining portion of the first conductive layer.

20. The method of fabricating a charge coupled device according to claim 14, wherein the second conductive layer is patterned such that the portion of the second conductive layer in which the second low resistance region is formed is larger than the remaining portion of the second conductive layer.

21. The method of fabricating a charge coupled device according to claim 14, further comprising a step of connecting wirings to the first and second low resistance regions for applying clock pulses to the first and second low resistance region.

22. A method of fabricating a charge coupled device on a substrate of a first conductivity type, the method comprising the steps of:

forming a charge coupled region of a second conductivity type that is different from the first conductivity type on the substrate;

forming a first insulating film on the charge coupled region;

forming a first conductive layer on the first insulating film;

patterning the first conductive layer to form first and second electrodes;

forming a second insulating film on the first and second electrodes and on the charge coupled region;

forming an impurity region in the surface of the charge coupled region between the first and second electrodes;

forming a third electrode above the impurity region, a thickness of the third electrode being substantially the same as thicknesses of the first and second electrodes;

forming a third insulating film on the first, second, and third electrodes; and forming a first low resistance region in the first electrode and forming a second low resistance region in the third electrode, the first low resistance region being adjacent to the second low resistance region.

23. The method of fabricating a charge coupled device according to claim 22, wherein the step of forming the third electrode includes the steps of:

forming a second conductive layer on the second insulating film;

forming a planarization layer on the second conductive layer;

etching the planarization layer to expose a portion of the second conductive layer; and etching the exposed portion of the second conductive layer.

24. The method of fabricating a charge coupled device according to claim 22, wherein the step of forming the first and second low resistance regions includes a step of implanting impurity ions in adjacent portions of the first and third electrodes.

25. The method of fabricating a charge coupled device according to claim 22, wherein the first low resistance region includes more than half of the first electrode.

26. The method of fabricating a charge coupled device according to claim 22, further comprising a step of connecting wirings to the first and second low resistance regions for applying clock pulses to the first and second low resistance regions.

* * * * *

UNITED STATES PATENT AND TRADEMARK OFFICE
CERTIFICATE OF CORRECTION

PATENT NO. : 5,607,872
DATED : March 4, 1997
INVENTOR(S) : Jae H. JEONG

It is certified that error appears in the above-indentified patent and that said Letters Patent is hereby corrected as shown below:

Title page,

Item [57] ABSTRACT: Line 1, "couples" should read --coupled--; and Line 6, "consisting a" should read --consisting of a--.

Column 9, line 23, "conductive" should be --conductive layer--.

Signed and Sealed this

Sixteenth Day of December, 1997

*Attest:*

BRUCE LEHMAN

*Attesting Officer*     *Commissioner of Patents and Trademarks*